US 11,852,670 B2

(12) United States Patent
Li et al.

(10) Patent No.: US 11,852,670 B2
(45) Date of Patent: Dec. 26, 2023

(54) METHOD FOR MONITORING INSULATION MONITORING CIRCUIT AND BATTERY MANAGEMENT SYSTEM

(71) Applicant: CONTEMPORARY AMPEREX TECHNOLOGY CO., LIMITED, Ningde (CN)

(72) Inventors: Meng Li, Ningde (CN); Changjian Liu, Ningde (CN); Fuming Ye, Ningde (CN); Fangjie Zhou, Ningde (CN); Liansong Wang, Ningde (CN); Lidan Yan, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 63 days.

(21) Appl. No.: 17/557,285

(22) Filed: Dec. 21, 2021

(65) Prior Publication Data

US 2022/0113344 A1    Apr. 14, 2022

Related U.S. Application Data

(63) Continuation of application No. PCT/CN2020/099543, filed on Jun. 30, 2020.

(30) Foreign Application Priority Data

Sep. 18, 2019    (CN) .......................... 201910881902.3

(51) Int. Cl.
*G01R 31/00* (2006.01)
*G01R 31/14* (2006.01)
(Continued)

(52) U.S. Cl.
CPC .............. *G01R 31/14* (2013.01); *B60L 58/10* (2019.02); *G01R 27/025* (2013.01);
(Continued)

(58) Field of Classification Search
CPC ................................ G01R 31/00; G01R 31/14
(Continued)

(56) References Cited

U.S. PATENT DOCUMENTS

| 2004/0189330 | A1 | 9/2004 | Herb et al. |
| 2013/0099795 | A1* | 4/2013 | Kamata .................. B60L 58/21 |
| | | | 324/434 |

(Continued)

FOREIGN PATENT DOCUMENTS

| CN | 1404578 A | 3/2003 |
| CN | 102426326 A | 4/2012 |

(Continued)

OTHER PUBLICATIONS

Search Report for International Application PCT/CN2020/099543 dated Sep. 28, 2020.

(Continued)

*Primary Examiner* — Vincent Q Nguyen
(74) *Attorney, Agent, or Firm* — Ladas & Parry LLP

(57) ABSTRACT

Embodiments of this application relate to the monitoring field, and disclose a method for monitoring an insulation monitoring circuit and a battery management system. In some embodiments of this application, the method for monitoring an insulation monitoring circuit includes: in a state in which a first switch and a second switch are closed and a third switch is open, obtaining a first electrical signal detected by a second monitoring module; and based on the first electrical signal and a voltage reference value between a positive electrode of a battery pack and a negative electrode of the battery pack, determining whether an insulation monitoring circuit is faulty; or obtaining a second electrical signal detected by a first monitoring module and a third electrical signal detected by a third monitoring module, and based on the second electrical signal and the third electrical (Continued)

signal, determining whether the insulation monitoring circuit is faulty.

7 Claims, 7 Drawing Sheets

(51) Int. Cl.
    *G01R 31/382*     (2019.01)
    *B60L 58/10*     (2019.01)
    *G01R 27/02*     (2006.01)
    *G01R 31/36*     (2020.01)
    *H01M 10/42*     (2006.01)

(52) U.S. Cl.
    CPC ....... *G01R 31/3648* (2013.01); *G01R 31/382* (2019.01); *H01M 10/425* (2013.01); *H01M 2010/4271* (2013.01); *H01M 2220/20* (2013.01)

(58) Field of Classification Search
    USPC .......................... 324/551, 557, 426, 432–435
    See application file for complete search history.

(56) References Cited

U.S. PATENT DOCUMENTS

| | | | |
|---|---|---|---|
| 2014/0084933 A1 | 3/2014 | Jang et al. | |
| 2014/0159908 A1 | 6/2014 | Hong et al. | |
| 2016/0154064 A1* | 6/2016 | Klein | G01R 31/3277 324/433 |
| 2017/0307676 A1 | 10/2017 | Gaouda et al. | |
| 2019/0237815 A1* | 8/2019 | Dan | G02B 6/0078 |

FOREIGN PATENT DOCUMENTS

| | | |
|---|---|---|
| CN | 202758040 U | 2/2013 |
| CN | 105425155 A | 3/2016 |
| CN | 205353257 U | 6/2016 |
| CN | 206020596 U | 3/2017 |
| CN | 206725655 U | 12/2017 |
| CN | 207164196 U | 3/2018 |
| CN | 207336698 U | 5/2018 |
| CN | 108152749 A | 6/2018 |
| CN | 108333492 A | 7/2018 |
| CN | 208109933 U | 11/2018 |
| CN | 109521277 A | 3/2019 |
| CN | 109633240 A | 4/2019 |
| CN | 110174625 A | 8/2019 |
| EP | 1437600 A | 7/2004 |

OTHER PUBLICATIONS

Written Opinion for International Application PCT/CN2020/099543 dated Sep. 28, 2020.
Extended European Search Report for EP Application No. 20864386.6, dated Feb. 15, 2022.
Notification to grant patent right for invention, CN application No. 201910881902.3.
First search report for CN application No. 201910881902.3.
Decision to grant an European patent for EP application No. 20864386.6, dated Jan. 9, 2022.

* cited by examiner

METHOD FOR MONITORING INSULATION MONITORING CIRCUIT AND BATTERY MANAGEMENT SYSTEM

CROSS-REFERENCE TO RELATED APPLICATIONS

This application is a continuation of International Patent Application No. PCT/CN2020/099543, filed on Jun. 30, 2020, which claims priority to Chinese Patent Application No. 201910881902.3, filed on Sep. 18, 2019. The aforementioned patent applications are incorporated herein by reference in their entirety.

TECHNICAL FIELD

Embodiments of this application relate to the monitoring field, and in particular, to a method for monitoring an insulation monitoring circuit and a battery management system.

BACKGROUND

Replacing gas-powered vehicles with electric vehicles has become a development trend of the automotive industry. The endurance mileage, service life, and safety of a battery pack are especially important for use of the electric vehicle. The traction battery pack serves as one of key parts of the electric vehicle, and safety of its high-voltage power needs to be one of primary considerations of a power battery system. Therefore, insulation performance monitoring for the electric vehicles is an essential part of design.

However, the inventor has found at least the following prior-art problem: an insulation monitoring module is prone to faults and cannot accurately monitor insulation resistance.

SUMMARY

An objective of embodiments of this application is to provide a method for monitoring an insulation monitoring circuit and a battery management system, so as to detect whether an insulation monitoring module is faulty, thereby reducing a problem of an excessively large deviation of insulation monitoring accuracy due to displacement of components of the insulation monitoring circuit, and improving safety performance of a vehicle.

In order to resolve the foregoing technical problem, an embodiment of this application provides a method for monitoring an insulation monitoring circuit, applied to a control module of a battery management system. The battery management system includes the control module and an insulation monitoring circuit. The insulation monitoring circuit includes a first voltage divider module, a second voltage divider module, a sampling module, and a first monitoring module. A first end of the first voltage divider module is connected to a positive electrode of a battery pack, a second end of the first voltage divider module is connected to a first end of the second voltage divider module, and a second end of the second voltage divider module is connected to a negative electrode of the battery pack. A node between the second end of the first voltage divider module and the first end of the second voltage divider module is connected to a first end of the sampling module, a second end of the sampling module is connected to a reference potential point, a first end of the first monitoring module is connected to the first end of the sampling module, and a second end of the first monitoring module is connected to the control module.

The first voltage divider module includes a first voltage divider unit, a second voltage divider unit, and a first switch, and the first voltage divider unit, the second voltage divider unit, and the first switch are connected in series. The second voltage divider module includes a third voltage divider unit, a fourth voltage divider unit, and a second switch, and the third voltage divider unit, the fourth voltage divider unit, and the second switch are connected in series. The sampling module includes a third switch and a sampling unit, and the third switch and the sampling unit are connected in series. The monitoring method includes: in a state in which the first switch and the second switch are closed and the third switch is open, obtaining a first electrical signal detected by a second monitoring module, where the second monitoring module is configured to monitor an electrical signal between a first node and a second node of the insulation monitoring circuit, the second monitoring module is connected to the control module, N voltage divider units of the first voltage divider unit, the second voltage divider unit, the third voltage divider unit, and the fourth voltage divider unit are included between the first node and the second node, and N is an integer greater than 0 and less than 4; and determining, based on the first electrical signal and a voltage reference value between the positive electrode of the battery pack and the negative electrode of the battery pack, whether the insulation monitoring circuit is faulty; or obtaining a second electrical signal detected by the first monitoring module and a third electrical signal detected by a third monitoring module, where the third monitoring module is configured to monitor an electrical signal between a third node and a fourth node; and determining, based on the second electrical signal and the third electrical signal, whether the insulation monitoring circuit is faulty. If the first voltage divider unit and/or the second voltage divider unit is included between the third node and the fourth node, the second electrical signal and the third electrical signal are obtained in a state in which the first switch and the third switch are closed and the second switch is open; if the third voltage divider unit and/or the fourth voltage divider unit is included between the third node and the fourth node, the second electrical signal and the third electrical signal are obtained in a state in which the second switch and the third switch are closed and the first switch is open.

An embodiment of this application further provides a battery management system, including a control module and an insulation monitoring circuit. The insulation monitoring circuit includes a first voltage divider module, a second voltage divider module, a sampling module, and a first monitoring module. A first end of the first voltage divider module is connected to a positive electrode of a battery pack, a second end of the first voltage divider module is connected to a first end of the second voltage divider module, and a second end of the second voltage divider module is connected to a negative electrode of the battery pack. A node between the second end of the first voltage divider module and the first end of the second voltage divider module is connected to a first end of the sampling module, a second end of the sampling module is connected to a reference potential point, a first end of the first monitoring module is connected to the first end of the sampling module, and a second end of the first monitoring module is connected to the control module. The first voltage divider module includes a first voltage divider unit, a second voltage divider unit, and a first switch, and the first voltage divider unit, the second voltage divider unit, and the first switch are connected in series. The second voltage divider module includes a third voltage divider unit, a fourth voltage divider unit, and a second switch, and the third voltage divider unit, the fourth voltage divider unit, and the second switch are connected in series. The sampling module includes a third switch and a sampling unit, and the third switch and the sampling unit are connected in series; and the control module is configured to execute the method for monitoring an insulation monitoring circuit described in the foregoing embodiment.

Compared with the prior art, in the embodiments of this application, an monitoring module is added to the insulation monitoring circuit, and whether the insulation monitoring circuit is faulty is determined based on an electrical signal detected by the added monitoring module, so that a related fault can be detected in a timely manner when the insulation monitoring circuit is faulty. This reduces a problem of an excessively large deviation of insulation monitoring accuracy due to deviation of components of the insulation monitoring circuit, thereby reducing a risk of an electric shock on a human body due to aging or deviation, and improving the safety performance of the vehicle.

In some embodiments, the determining, based on the first electrical signal and a voltage reference value between a positive electrode of a battery pack and a negative electrode of the battery pack, whether an insulation monitoring circuit is faulty includes: calculating a first voltage value between the positive electrode of the battery pack and the negative electrode of the battery pack based on the first electrical signal, a resistance value of the first voltage divider unit, a resistance value of the second voltage divider unit, a resistance value of the third voltage divider unit, and a resistance value of the fourth voltage divider unit; determining whether a difference between the first voltage value and the voltage reference value is greater than a first threshold; and if a determination result is yes, determining that the insulation monitoring circuit is faulty.

In some embodiments, the battery management system further includes a high-voltage sampling circuit and a fourth monitoring module. The high-voltage sampling circuit includes a fifth voltage divider unit and a sixth voltage divider unit, and the fifth voltage divider unit and the sixth voltage divider unit are connected in series. A first end of the high-voltage sampling circuit is connected to the positive electrode of the battery pack, and a second end of the high-voltage sampling circuit is connected to the negative electrode of the battery pack. The fourth monitoring module is configured to monitor an electrical signal across two ends of the fifth voltage divider unit or the sixth voltage divider unit, and the fourth monitoring module is connected to the control module. Before the determining whether a difference between the first voltage value and the voltage reference value is greater than a first threshold, the method for monitoring an insulation monitoring circuit further includes: obtaining a fourth electrical signal detected by the fourth monitoring module; and calculating the voltage reference value based on the fourth electrical signal, a resistance value of the fifth voltage divider unit, and a resistance value of the sixth voltage divider unit. In this embodiment, the voltage reference value is determined based on a monitoring result of the high-voltage sampling circuit, with no need to redesign a monitoring circuit, thereby simplifying the circuit structure.

In some embodiments, a voltage divider unit between the first node and the second node is the first voltage divider unit and/or the second voltage divider unit. If the difference between the first voltage value and the voltage reference value is less than or equal to the first threshold, the method for monitoring an insulation monitoring circuit further includes: in a state in which the third switch and the first switch are closed and the second switch is open, obtaining a fifth electrical signal detected by the first monitoring module and a sixth electrical signal detected by the second monitoring module; and based on the fifth electrical signal and the sixth electrical signal, determining whether the insulation monitoring circuit is faulty.

In some embodiments, a voltage divider unit between the first node and the second node is the third voltage divider unit and/or the fourth voltage divider unit. If the difference between the first voltage value and the voltage reference value is less than or equal to the first threshold, the method for monitoring an insulation monitoring circuit further includes: in a state in which the third switch and the second switch are closed and the first switch is open, obtaining a seventh electrical signal detected by the first monitoring module and an eighth electrical signal detected by the second monitoring module; and based on the seventh electrical signal and the eighth electrical signal, determining whether the insulation monitoring circuit is faulty.

In some embodiments, if the first voltage divider unit and/or the second voltage divider unit is included between the third node and the fourth node, the determining, based on the second electrical signal and the third electrical signal, whether the insulation monitoring circuit is faulty includes: calculating a second voltage value between the positive electrode of the battery pack and the reference potential point based on the second electrical signal, a resistance value of the sampling module, a resistance value of the first voltage divider unit, and a resistance value of the second voltage divider unit; calculating a third voltage value between the positive electrode of the battery pack and the reference potential point based on the third electrical signal, the resistance value of the sampling module, the resistance value of the first voltage divider unit, and the resistance value of the second voltage divider unit; determining whether a difference between the second voltage value and the third voltage value is greater than a second threshold; and if a determination result is yes, determining that the insulation monitoring circuit is faulty.

In some embodiments, if the first voltage divider unit and/or the second voltage divider unit is included between the third node and the fourth node, the determining, based on the second electrical signal and the third electrical signal, whether the insulation monitoring circuit is faulty includes: based on the second electrical signal and a resistance value of the sampling module, calculating a first current value of a branch in which the sampling module is located; based on the third electrical signal and a resistance value of the first voltage divider unit and/or a resistance value of the second voltage divider unit, calculating a second current value of a branch in which the first voltage divider unit and the second voltage divider unit are located; determining whether a difference between the first current value and the second current value is greater than a third threshold; and if a determination result is yes, determining that the insulation monitoring circuit is faulty.

In addition, if the third voltage divider unit and/or the fourth voltage divider unit is included between the third node and the fourth node, the determining, based on the second electrical signal and the third electrical signal, whether the insulation monitoring circuit is faulty includes: calculating a second voltage value between the negative electrode of the battery pack and the reference potential point based on the second electrical signal, a resistance value of the sampling module, a resistance value of the third voltage divider unit, and a resistance value of the fourth voltage divider unit; calculating a third voltage value between the negative electrode of the battery pack and the reference potential point based on the third electrical signal, the resistance value of the sampling module, the resistance value of the third voltage divider unit, and the resistance value of the fourth voltage divider unit; determining whether a difference between the second voltage value and a second voltage reference value is greater than a second threshold; and if a determination result is yes, determining that the insulation monitoring circuit is faulty.

In addition, if the third voltage divider unit and/or the fourth voltage divider unit is included between the third node and the fourth node, the determining, based on the second electrical signal and the third electrical signal, whether the insulation monitoring circuit is faulty includes: based on the second electrical signal and a resistance value of the sampling module, calculating a first current value of a branch in which the sampling module is located; based on the third electrical signal and a resistance value of the third voltage divider unit and/or a resistance value of the fourth voltage divider unit, calculating a second current value of a branch in which the third voltage divider unit and the fourth voltage divider unit are located; determining whether a difference between the first current value and the second current value is greater than a third threshold; and if a determination result is yes, determining that the insulation monitoring circuit is faulty.

BRIEF DESCRIPTION OF DRAWINGS

One or more embodiments are exemplarily described with reference to the corresponding accompanying drawings. The exemplary descriptions do not constitute any limitation on the embodiments. Components with the same reference signs in the drawings are denoted as similar components. Unless otherwise specified, the accompanying drawings do not constitute any limitation on the scale.

DESCRIPTION OF EMBODIMENTS

To make the objectives, technical solutions, and advantages of the embodiments of this application clearer, the following further describes in detail the embodiments of this application with reference to the accompanying drawings. However, those of ordinary skill in the art can understand that in the embodiments of this application, many technical details are proposed in order to enable readers to better understand this application. Even without these technical details and various changes and modifications based on the following embodiments, the technical solutions claimed in this application can still be implemented.

Ordinal numbers, such as "first" and "second", assigned to components in this specification are merely intended to distinguish the described objects and do not have any sequence or technical meaning. The "connection" and "link" described in this application include direct and indirect connection (link) unless otherwise specified.

Figure 1:
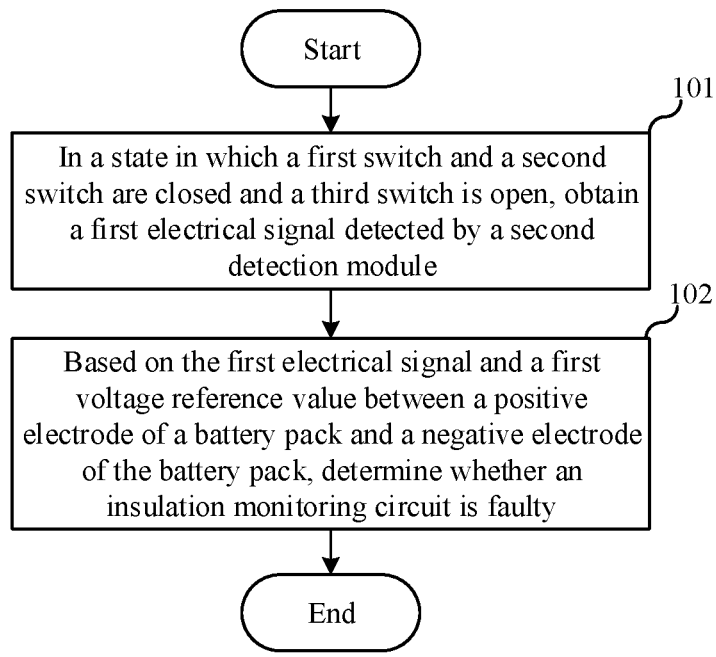
FIG. 1 is a flowchart of an insulation monitoring method according to a first embodiment of this application.

A first embodiment of this application relates to a method for monitoring an insulation monitoring circuit, applied to a control module of a battery management system. As shown in FIG. 1, the method for monitoring an insulation monitoring circuit includes the following steps.

Step 101: In a state in which a first switch and a second switch are closed and a third switch is open, obtain a first electrical signal detected by a second monitoring module.

Specifically, the battery management system includes a control module and an insulation monitoring circuit. The insulation monitoring circuit includes a first voltage divider module, a second voltage divider module, a sampling module, and a first monitoring module. A first end of the first voltage divider module is connected to a positive electrode of a battery pack, a second end of the first voltage divider module is connected to a first end of the second voltage divider module, and a second end of the second voltage divider module is connected to a negative electrode of the battery pack. A node between the second end of the first voltage divider module and the first end of the second voltage divider module is connected to a first end of the sampling module, a second end of the sampling module is connected to a reference potential point, a first end of the first monitoring module is connected to the first end of the sampling module, and a second end of the first monitoring module is connected to the control module. The first voltage divider module includes a first voltage divider unit, a second voltage divider unit, and a first switch, and the first voltage divider unit, the second voltage divider unit, and the first switch are connected in series. The second voltage divider module includes a third voltage divider unit, a fourth voltage divider unit, and a second switch, and the third voltage divider unit, the fourth voltage divider unit, and the second switch are connected in series. The sampling module includes a third switch and a sampling unit, and the third switch and the sampling unit are connected in series. The second monitoring module is configured to monitor an electrical signal between a first node and a second node of the insulation monitoring circuit, the second monitoring module is connected to the control module, N voltage divider units of the first voltage divider unit, the second voltage divider unit, the third voltage divider unit, and the fourth voltage divider unit are included between the first node and the second node, and N is an integer greater than 0 and less than 4.

In one embodiment, withstand voltage values of the first switch and the second switch are less than a withstand voltage value of the third switch. An insulation withstand voltage of the third switch is very high and can meet insulation withstand voltage test requirements of the factory. Compared with an existing insulation monitoring circuit provided with four very-high-withstand-voltage switches, the insulation monitoring circuit in this embodiment features relatively low costs.

The following uses examples to describe a connection relationship between the first voltage divider unit, the second voltage divider unit, and the first switch in the first voltage divider module.

In a first example, the first voltage divider unit, the second voltage divider unit, and the first switch in the first voltage divider module are sequentially connected in series. That is, a first end of the first voltage divider unit serves as the first end of the first voltage divider module, a second end of the first voltage divider unit is connected to a first end of the second voltage divider unit, a second end of the second voltage divider unit is connected to a first end of the first switch, and a second end of the first switch serves as the second end of the first voltage divider module.

In a second example, the first voltage divider unit, the first switch, and the second voltage divider unit in the first voltage divider module are sequentially connected in series. That is, the first end of the first voltage divider unit serves as the first end of the first voltage divider module, the second end of the first voltage divider unit is connected to the first end of the first switch, the second end of the first switch is connected to the first end of the second voltage divider unit, and the second end of the second voltage divider unit serves as the second end of the first voltage divider module.

In a third example, the first switch, the first voltage divider unit, and the second voltage divider unit in the first voltage divider module are sequentially connected in series. That is, the first end of the first switch serves as the first end of the first voltage divider module, the second end of the first switch is connected to the first end of the first voltage divider unit, the second end of the first voltage divider unit is connected to the first end of the second voltage divider unit, and the second end of the second voltage divider unit serves as the second end of the first voltage divider module.

It should be noted that persons skilled in the art can understand that, in actual application, any one of the connection manners in the foregoing examples may be selected for the first voltage divider module or other connection manners are used, and a circuit connection relationship inside the first voltage divider module is not limited in this embodiment.

The following uses examples to describe a connection relationship between the third voltage divider unit, the fourth voltage divider unit, and the second switch in the second voltage divider module.

In a first example, the third voltage divider unit, the fourth voltage divider unit, and the second switch in the second voltage divider module are sequentially connected in series. That is, a first end of the third voltage divider unit serves as the first end of the second voltage divider module, a second end of the third voltage divider unit is connected to a first end of the fourth voltage divider unit, a second end of the fourth voltage divider unit is connected to a first end of the second switch, and a second end of the second switch serves as the second end of the second voltage divider module.

In a second example, the third voltage divider unit, the second switch, and the fourth voltage divider unit in the second voltage divider module are sequentially connected in series. That is, the first end of the third voltage divider unit serves as the first end of the second voltage divider module, the second end of the third voltage divider unit is connected to the first end of the second switch, the second end of the second switch is connected to the first end of the fourth voltage divider unit, and the second end of the fourth voltage divider unit serves as the second end of the second voltage divider module.

In a third example, the second switch, the third voltage divider unit, and the fourth voltage divider unit in the second voltage divider module are sequentially connected in series. That is, the first end of the second switch serves as the first end of the second voltage divider module, the second end of the second switch is connected to the first end of the third voltage divider unit, the second end of the third voltage divider unit is connected to the first end of the fourth voltage divider unit, and the second end of the fourth voltage divider unit serves as the second end of the second voltage divider module.

It should be noted that persons skilled in the art can understand that, in actual application, any one of the connection manners in the foregoing examples may be selected for the second voltage divider module or other connection manners are used, and a circuit connection relationship inside the second voltage divider module is not limited in this embodiment.

In one embodiment, the sampling unit in the sampling module may include one or more resistors, and the one or more resistors are sequentially connected in series. An internal connection relationship of the sampling module may be either of the following two connection manners:

Manner 1: A first end of the third switch serves as the first end of the sampling module, a second end of the third switch is connected to a first end of the sampling unit, and a second end of the sampling unit serves as the second end of the sampling module.

Manner 2: A first end of the sampling unit serves as the first end of the sampling module, a second end of the sampling unit is connected to a first end of the third switch, and a second end of the third switch serves as the second end of the sampling module.

In one embodiment, the reference potential point is a ground point.

It should be noted that persons skilled in the art can understand that the first switch, the second switch, and the third switch may be manual control switches that are manually controlled to be closed or open, or may be connected to the control module and controlled by the control module to be closed or open. Types of the first switch, the second switch, and the third switch are not limited in this embodiment.

In one embodiment, each voltage divider unit is formed by one or more resistors sequentially in series. A quantity of resistors connected in series in each voltage divider unit may be the same or different, and persons skilled in the art may set a quantity of resistors for each voltage divider unit as required. For example, the first voltage divider unit, the second voltage divider unit, the third voltage divider unit, and the fourth voltage divider unit each are formed by one resistor. Alternatively, the first voltage divider unit is formed by P resistors sequentially connected in series, the second voltage divider unit is formed by Q resistors sequentially connected in series, the third voltage divider unit is formed by M resistors sequentially connected in series, and the fourth voltage divider unit is formed by N resistors sequentially connected in series. P, Q, M, and N are all integers greater than 1.

It should be noted that persons skilled in the art can understand that total resistance values of the first voltage divider module and the second voltage divider module may be the same or different, which is not limited in this embodiment.

The following uses examples to describe a connection relationship between the second monitoring module and the insulation monitoring circuit.

In a first example, N is equal to 1, and the first voltage divider unit, or the second voltage divider unit, or the third voltage divider unit, or the fourth voltage divider unit is included between the first node and the second node. For example, the first node and the second node are nodes at two ends of the first voltage divider unit, or nodes at two ends of the second voltage divider unit, or nodes at two ends of the third voltage divider unit, or nodes at two ends of the fourth voltage divider unit. In this case, the first end and the second end of the second monitoring module are respectively connected to two ends of any one of the first voltage divider unit, the second voltage divider unit, the third voltage divider unit, and the fourth voltage divider unit. A third end of the second monitoring module is connected to the control module, and is configured to monitor a voltage signal across two ends of any one of the first voltage divider unit, the second voltage divider unit, the third voltage divider unit, and the fourth voltage divider unit.

In a second example, N is equal to 2. The first voltage divider unit, the second voltage divider unit, and the first switch are sequentially connected in series. The second switch, the third voltage divider unit, and the fourth voltage divider unit are sequentially connected in series. The first voltage divider unit and the second voltage divider unit, or the third voltage divider unit and the fourth voltage divider unit, or the second voltage divider unit and the third voltage divider unit are included between the first node and the second node. For example, the first node is the first end of the first voltage divider unit, and the second node is the second end of the second voltage divider unit. The first end and the second end of the second monitoring module are respectively connected to the first end of the first voltage divider unit and the second end of the second voltage divider unit, and are configured to monitor a voltage signal between the first end of the first voltage divider unit and the second end of the second voltage divider unit. For another example, the first node is the first end of the third voltage divider unit, and the second node is the second end of the fourth voltage divider unit. The first end and the second end of the second monitoring module are respectively connected to the first end of the third voltage divider unit and the second end of the fourth voltage divider unit, and are configured to monitor a voltage signal between the first end of the third voltage divider unit and the second end of the fourth voltage divider unit. For another example, the first node is the first end of the second voltage divider unit, and the second node is the second end of the third voltage divider unit. The first end and the second end of the second monitoring module are respectively connected to the first end of the second voltage divider unit and the second end of the third voltage divider unit, and are configured to monitor a voltage signal between the first end of the second voltage divider unit and the second end of the third voltage divider unit.

In a third example, N is equal to 3. The first voltage divider unit, the second voltage divider unit, and the first switch are sequentially connected in series. The second switch, the third voltage divider unit, and the fourth voltage divider unit are sequentially connected in series. The first voltage divider unit, the second voltage divider unit, and the third voltage divider unit, or the second voltage divider unit, the third voltage divider unit, and the fourth voltage divider unit are included between the first node and the second node. For example, the first node is the first end of the first voltage divider unit, and the second node is the second end of the third voltage divider unit. The first end and the second end of the second monitoring module are respectively connected to the first end of the first voltage divider unit and the second end of the third voltage divider unit, and are configured to monitor a voltage signal between the first end of the first voltage divider unit and the second end of the third voltage divider unit. For another example, the first node is the first end of the second voltage divider unit, and the second node is the second end of the fourth voltage divider unit. The first end and the second end of the second monitoring module are respectively connected to the first end of the second voltage divider unit and the second end of the fourth voltage divider unit, and are configured to monitor a voltage signal between the first end of the second voltage divider unit and the second end of the fourth voltage divider unit.

Persons skilled in the art can understand that, in actual application, any one of the foregoing various implementations may be selected for the second monitoring module, which is not limited herein.

Step 102: Based on the first electrical signal and the voltage reference value between the positive electrode of the battery pack and the negative electrode of the battery pack, determine whether the insulation monitoring circuit is faulty.

Specifically, as a use time of the electric vehicle increases, each component in the insulation monitoring circuit is prone to a phenomenon such as aging or deviation. The insulation monitoring circuit may have a relatively large deviation of insulation monitoring accuracy when the components are aging or deviated due to the increase in the service life. In this case, an actual insulation resistance value may be relatively small while a finally calculated insulation resistance for the insulation monitoring circuit is relatively large due to aging of the components. Consequently, an insulation fault cannot be detected, and electrical leakage occurs in the battery pack due to excessively low insulation. In order to reduce the case that calculation for insulation monitoring is inaccurate due to aging or deviation of the components and consequently an alarm cannot be reported due to a relatively low insulation resistance value, a method for implementing self-diagnosis of the insulation monitoring circuit is proposed in this embodiment, to implement monitoring on a fault of the insulation monitoring module or deviation of the components by using a self-diagnosis policy. This solution greatly improves high-voltage safety of the vehicle, and avoids injuries such as electric shock caused by insulation leakage.

In one embodiment, the control module calculates a first voltage value between the positive electrode of the battery pack and the negative electrode of the battery pack based on the first electrical signal, a resistance value of the first voltage divider unit, a resistance value of the second voltage divider unit, a resistance value of the third voltage divider unit, and a resistance value of the fourth voltage divider unit; determines whether a difference between the first voltage value and the voltage reference value is greater than a first threshold; and if a determination result is yes, determines that the insulation monitoring circuit is faulty.

It should be noted that the first threshold may be set based on errors of monitoring circuits sampled inside the first monitoring module and the second monitoring module and monitoring errors of the first monitoring module and the second monitoring module in combination with experience of the designer, which is not limited in this embodiment.

In one embodiment, the battery management system further includes a high-voltage sampling circuit and a fourth monitoring module. The high-voltage sampling circuit includes a fifth voltage divider unit and a sixth voltage divider unit. The fifth voltage divider unit and the sixth voltage divider unit are connected in series, a first end of the high-voltage sampling circuit is connected to the positive electrode of the battery pack, and a second end of the high-voltage sampling circuit is connected to the negative electrode of the battery pack. The fourth monitoring module is configured to monitor an electrical signal across two ends of the fifth voltage divider unit or the sixth voltage divider unit, and the fourth monitoring module is connected to the control module. The process of determining the voltage reference value is as follows: In a case in which the first switch and the second switch are closed and the third switch is open, obtaining a fourth electrical signal detected by the fourth monitoring module; and calculating the voltage reference value based on the fourth electrical signal, a resistance value of the fifth voltage divider unit, and a resistance value of the sixth voltage divider unit. The fifth voltage divider unit and the sixth voltage divider unit may be formed by one or more resistors. A first end and a second end of the fourth monitoring module are respectively connected to two ends of the fifth voltage divider unit or the sixth voltage divider unit, and a third end of the fourth monitoring module is connected to the control module.

Figure 2:
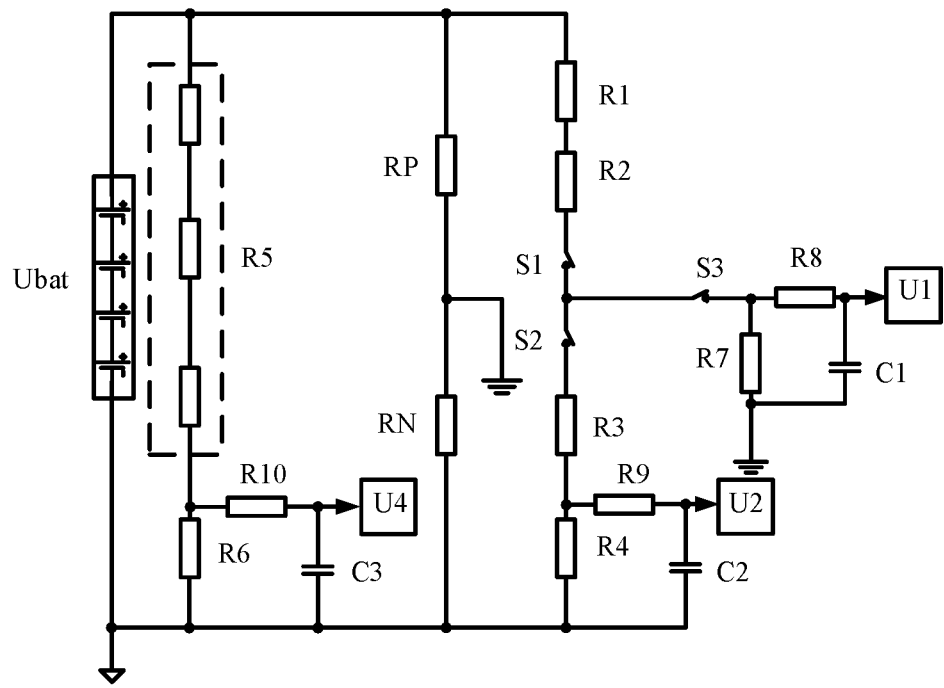
FIG. 2 is a schematic circuit diagram of a battery management system according to the first embodiment of this application.
Figure 3:
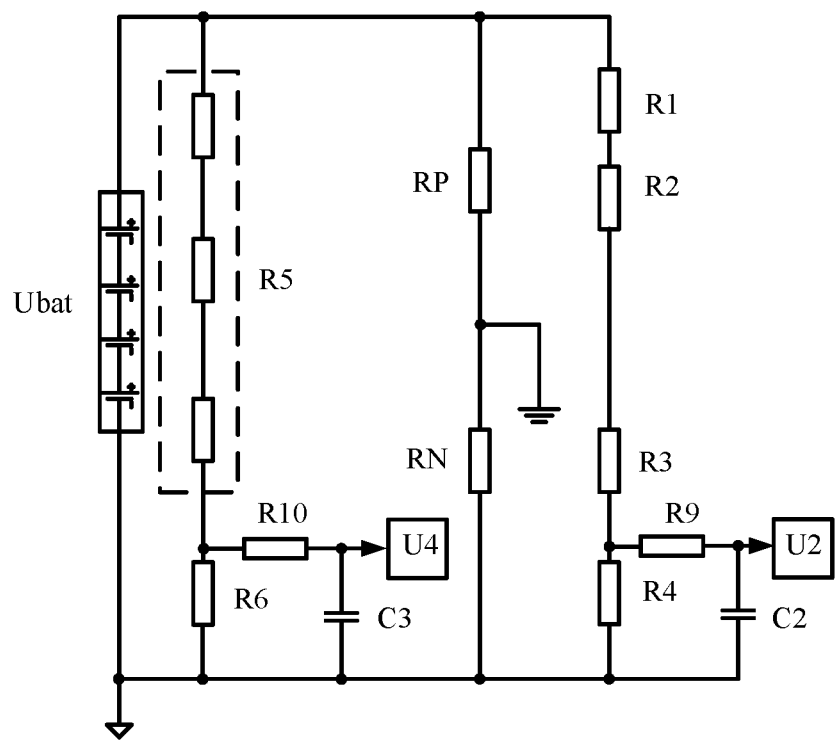
FIG. 3 is an equivalent circuit diagram of the battery management system according to the first embodiment of this application.

For example, the fifth voltage divider unit is formed by three resistors connected in series, the sixth voltage divider unit is formed by one resistor, the fourth monitoring module is configured to monitor an electrical signal (voltage signal) across two ends of the sixth voltage divider unit, and the fourth voltage divider unit is included between the first node and the second node. In this case, a circuit diagram of the battery management system is shown in FIG. 2. Ubat represents the battery pack, R1 represents the first voltage divider unit, R2 represents the second voltage divider unit, R3 represents the third voltage divider unit, R4 represents the fourth voltage divider unit, R5 represents the fifth voltage divider unit, R6 represents the sixth voltage divider unit, R7 represents the sampling unit, R8 represents the first resistor, R9 represents the second resistor, R10 represents the third resistor, S1 represents the first switch, S2 represents the second switch, S3 represents the third switch, C1 represents the first capacitor, C2 represents the second capacitor, C3 represents the third capacitor, U1 is the second end of the first monitoring module, U2 represents the third end of the second monitoring module, U4 represents the third end of the fourth monitoring module, RP represents an insulation resistance of the positive electrode of the battery pack to the ground, and RN represents the insulation resistance of the negative electrode of the battery pack to the ground. R1, R2, and S1 form the first voltage divider module, R3, R4 and S2 form the second voltage divider module, R5 and R6 form the high-voltage sampling circuit, R7 and S3 form the sampling module, R8 and C1 form the first monitoring module, R9 and C2 form the second monitoring module, and R10 and C3 form the fourth monitoring module. U1, U2, and U4 are connected to the control module (not shown in the figure). When S1 and S2 are closed and S3 is open, the equivalent circuit diagram is shown in FIG. 3. The control module calculates a voltage value of the Ubat (a first voltage value Ubat1) based on the first electrical signal $u_1$ obtained through sampling at the U2, and a calculation formula is as follows:

$$Ubat1 = \frac{u_4}{R_4} \cdot (R_1 + R_2 + R_3 + R_4) \qquad \text{Formula a}$$

A voltage value of the Ubat (a first reference voltage value Ubat2) is calculated based on the fourth electrical signal U4 obtained through sampling at the U4, and a calculation formula is as follows:

$$Ubat2 = \frac{u_4}{R_5} \cdot (R_5 + R_6) \qquad \text{Formula b}$$

Because both the divided voltages obtained through sampling and calculation are voltages of the battery pack, whether the sampling insulation monitoring circuit is faulty may be determined through the first voltage value and the first reference voltage value. Specifically, when the first voltage value and the first reference voltage value are not equal or a difference between the first voltage value and the first reference voltage value exceeds an allowable error range, it indicates that the first voltage divider module and/or the second voltage divider module may be deviated, the insulation monitoring circuit has a fault, and the control module may report the fault, thereby avoiding a problem that the calculated insulation resistance value is relatively large due to the deviation of the first voltage divider module and/or the second voltage divider module.

It should be noted that, through comparison of the first voltage value and the first reference voltage value, whether the insulation monitoring circuit is faulty can be determined, thereby avoiding a problem that the calculated insulation resistance value is relatively large due to the deviation of the first voltage divider module and/or the second voltage divider module.

In one embodiment, after determining that the difference between the first voltage value and the voltage reference value is less than or equal to the first threshold, the control module may detect whether the sampling module and the first monitoring module are faulty. The following uses examples to describe a process of monitoring by the control module whether the sampling module and the first monitoring module are faulty.

Case 1: The voltage divider unit between the first node and the second node is the first voltage divider unit and/or the second voltage divider unit, that is, the second monitoring module is configured to monitor a voltage across two ends of the first voltage divider unit, or a voltage across two ends of the second voltage divider unit, or a voltage between the first end of the first voltage divider unit and the second end of the second voltage divider unit. After determining that the difference between the first voltage value and the voltage reference value is less than or equal to the first threshold, in a state in which the third switch and the first switch are closed and the second switch is open, the control module obtains the fifth electrical signal detected by the first monitoring module and the sixth electrical signal detected by the second monitoring module; and based on the fifth electrical signal and the sixth electrical signal, determines whether the insulation monitoring circuit is faulty.

Figure 4:
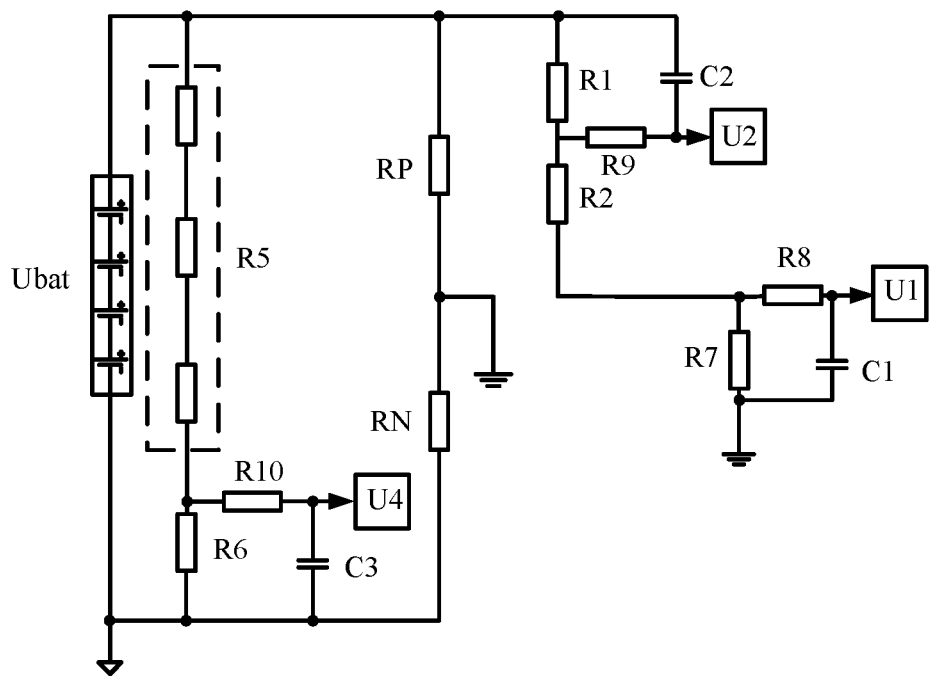
FIG. 4 is another equivalent circuit diagram of the battery management system according to a first embodiment of this application.

Assuming that the second monitoring module is configured to monitor a voltage across two ends of the first voltage divider unit, the equivalent circuit diagram of the battery management system is shown in FIG. 4 in the case in which the first switch and the third switch are closed and the second switch is open. Meanings of the parameters are the same as those in FIG. 2. The fifth electrical signal $u_5$ is obtained by sampling a voltage across two ends of the R7 by the first monitoring module, and a voltage Up1 of the positive electrode of the battery pack with respect to the low-voltage ground can be obtained through inversion. A calculation formula is as follows:

$$Up1 = \frac{u_4}{R_7} \cdot (R_1 + R_2 + R_7) \qquad \text{Formula c}$$

The sixth electrical signal $u_6$ is obtained by sampling a voltage across two ends of the R1 by the second monitoring module, and a voltage Up2 of the positive electrode of the battery pack with respect to the low-voltage ground can be obtained through inversion. A calculation formula is as follows:

$$Up2 = \frac{u_4}{R_7} \cdot (R_1 + R_2 + R_7) \qquad \text{Formula d}$$

Because both the calculated values are voltages of the positive electrode of the battery pack with respect to the low-voltage ground, the two values are similar or the same in normal cases. If the first monitoring module is faulty, or the sampling module, the first voltage divider unit, or the second voltage divider unit is deviated, a difference between the two values is relatively large. Therefore, whether the first monitoring module (a sampling chip of the insulation monitoring circuit) and the sampling module are faulty can be determined based on Up1 and Up2. When the difference between Up1 and Up2 is greater than a preset fourth threshold, it is determined that the insulation monitoring circuit is faulty, and an insulation monitoring fault needs to be reported in this case.

It should be noted that through comparison of Up1 and Up2, the problem that a calculated insulation resistance value is inaccurate due to a fault of the sampling module and the first monitoring module can be avoided.

Case 2: The voltage divider unit between the first node and the second node is the third voltage divider unit and/or the fourth voltage divider unit, that is, the second monitoring module is configured to monitor a voltage across two ends of the third voltage divider unit, or a voltage across two ends of the fourth voltage divider unit, or a voltage between the first end of the third voltage divider unit and the second end of the fourth voltage divider unit. After determining that the difference between the first voltage value and the voltage reference value is less than or equal to the first threshold, in a state in which the third switch and the second switch are closed and the first switch is open, the control module obtains the seventh electrical signal detected by the first monitoring module and the eighth electrical signal detected by the second monitoring module; and based on the seventh electrical signal and the eighth electrical signal, determines whether the insulation monitoring circuit is faulty.

Figure 5:
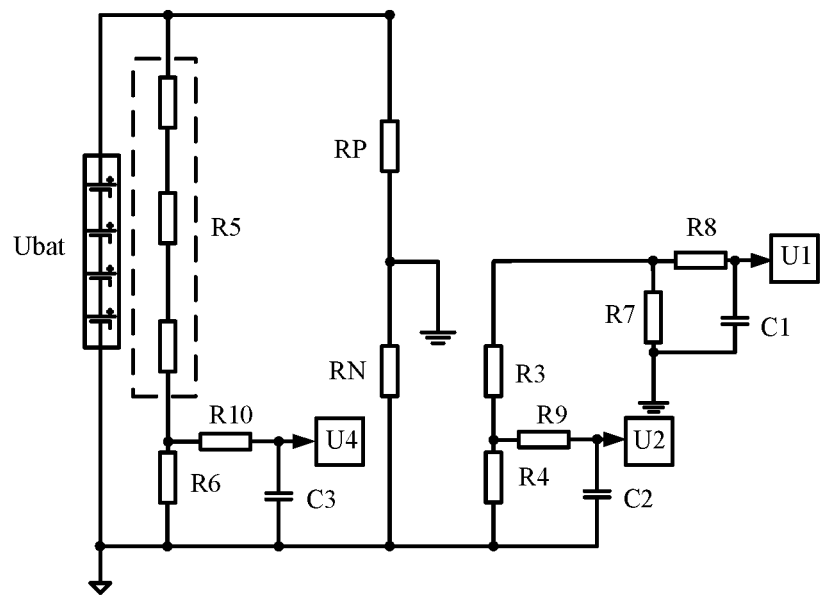
FIG. 5 is still another equivalent circuit diagram of the battery management system according to the first embodiment of this application.

Assuming that the second monitoring module is configured to monitor a voltage across two ends of the fourth voltage divider unit, the equivalent circuit diagram of the battery management system is shown in FIG. 5 in the case in which the second switch and the third switch are closed and the first switch is open. Meanings of the parameters are the same as those in FIG. 2. In this case, the seventh electrical signal $u_7$ is obtained by sampling a voltage across two ends of the R7 by the first monitoring module, and it can be learned from a current flow direction that $u_7$ is a negative value. A voltage Un1 of the low-voltage ground with respect to the negative electrode of the battery pack can be obtained through inversion. A calculation formula is as follows:

$$Un1 = \frac{-u_4}{R_7} \cdot (R_2 + R_4 + R_7) \qquad \text{Formula e}$$

The eighth electrical signal $u_8$ is obtained by sampling a voltage across two ends of the R4 by the second monitoring module, and it can be learned from a current flow direction that $u_8$ is a positive value. A voltage Un2 of the low-voltage ground with respect to the negative electrode of the battery pack can be obtained through inversion. A calculation formula is as follows:

$$Un2 = \frac{u_4}{R_4} \cdot (R_3 + R_4 + R_7) \qquad \text{Formula f}$$

Because both the calculated values are voltages of the low-voltage ground with respect to the negative electrode of the battery pack, the two values are similar or the same in normal cases. If the first monitoring module is faulty, or the sampling module, the third voltage divider unit, or the fourth voltage divider unit is deviated, a difference between the two values is relatively large. Therefore, whether the first monitoring module (a sampling chip of the insulation monitoring circuit) and the sampling module are faulty can be determined based on Un1 and Un2. When the difference between Un1 and Un2 is greater than a preset fifth threshold, it is determined that the insulation monitoring circuit is faulty, and an insulation monitoring fault needs to be reported in this case.

It should be noted that persons skilled in the art can understand that in actual application, a current of a branch in which the sampling module is located may alternatively be calculated separately by using the fifth electrical signal and the sixth electrical signal, and whether the sampling module and the first monitoring module are faulty is determined based on a difference obtained by comparing the current values calculated based on the two electrical signals. This embodiment does not limit a specific manner in which the control module determines, based on the fifth electrical signal and the sixth electrical signal, whether the insulation monitoring module is faulty.

Case 3: The voltage divider unit between the first node and the second node is the third voltage divider unit and/or the fourth voltage divider unit, and the battery management system further includes a fifth monitoring module. The fifth monitoring module is configured to monitor an electrical signal across two ends of the first voltage divider unit and/or the second voltage divider unit, and the fifth monitoring module is connected to the control module. In a state in which the third switch and the first switch are closed and the second switch is open, the control module obtains a ninth electrical signal detected by the first monitoring module and a tenth electrical signal detected by the fifth monitoring module, and determines, based on the ninth electrical signal and the tenth electrical signal, whether the insulation monitoring circuit is faulty.

Figure 6:
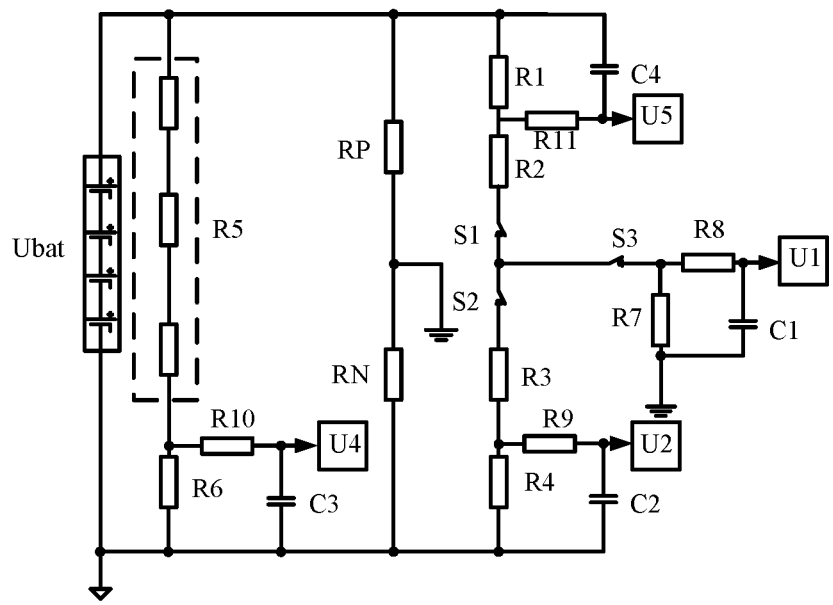
FIG. 6 is another schematic circuit diagram of the battery management system according to the first embodiment of this application.

Assuming that the second monitoring module is configured to monitor a voltage signal across two ends of the fourth voltage divider unit, the first end and the second end of the fifth monitoring module are respectively connected to the two ends of the first voltage divider unit, and a third end of the fifth monitoring module is connected to the control module and is configured to monitor an electrical signal across two ends of the first voltage divider unit, the circuit diagram of the battery management system is shown in FIG. 6. R11 represents a fourth resistor, C4 represents a fourth capacitor, R11 and C4 form the fifth monitoring module, and U5 represents the third end of the fifth monitoring module. Meanings of other parameters are the same as those in FIG. 2, and details are not repeated herein.

Case 4: The voltage divider unit between the first node and the second node is the first voltage divider unit and/or the second voltage divider unit, and the battery management system further includes a sixth monitoring module. The sixth monitoring module is configured to monitor an electrical signal across two ends of the third voltage divider unit and/or the fourth voltage divider unit, and the sixth monitoring module is connected to the control module. In a state in which the third switch and the second switch are closed and the first switch is open, the control module obtains an eleventh electrical signal detected by the first monitoring module and a twelfth electrical signal detected by the sixth monitoring module, and determines, based on the eleventh electrical signal and the twelfth electrical signal, whether the insulation monitoring circuit is faulty.

Figure 7:
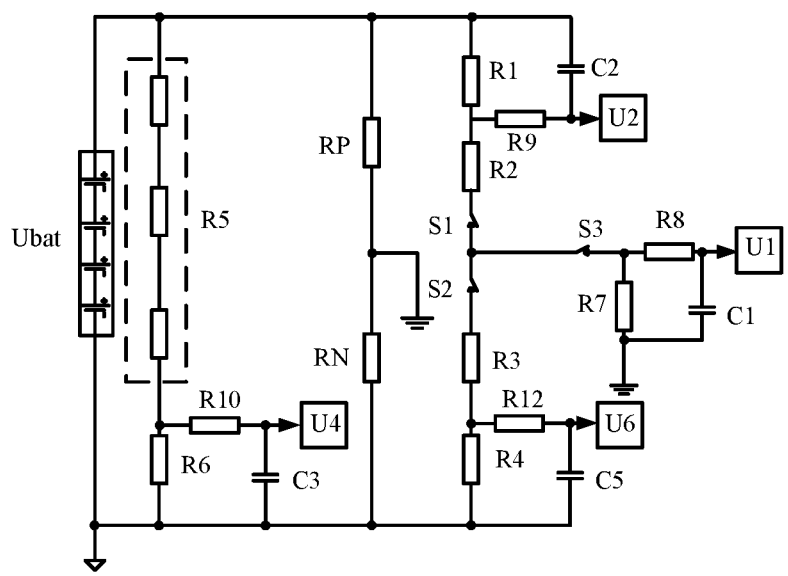
FIG. 7 is still another schematic circuit diagram of the battery management system according to the first embodiment of this application.

Assuming that the second monitoring module is configured to monitor a voltage signal across two ends of the first voltage divider unit, the first end and the second end of the sixth monitoring module are respectively connected to the two ends of the fourth voltage divider unit, and a third end of the sixth monitoring module is connected to the control module and is configured to monitor an electrical signal across two ends of the fourth voltage divider unit, the circuit diagram of the battery management system is shown in FIG. 7. R12 represents a fifth resistor, C5 represents a fifth capacitor, R12 and C5 form the sixth monitoring module, and U6 represents the third end of the sixth monitoring module. Meanings of other parameters are the same as those in FIG. 2, and details are not repeated herein.

It should be noted that persons skilled in the art can understand that, in actual application, a setting manner of the second monitoring module may be selected as required, and whether to add the fifth monitoring module or the sixth monitoring module may be determined based on the setting manner of the second monitoring module and a selected monitoring method, which is not limited in this embodiment.

It should be noted that persons skilled in the art can understand that, in actual application, the control module may simultaneously calculate insulation resistance values RN and RP of a vehicle by using Formula b, Formula c, and Formula f. For the calculation method thereof, refer to other related content, which is not described in detail herein.

The following uses examples to describe a method of combining insulation monitoring and insulation monitoring circuit.

Step 1011: Power on the vehicle at a low voltage.

Step 1012: Close the first switch and the second switch, open the third switch, collect the first electrical signal and the fourth electrical signal, calculate the first voltage value based on the first electrical signal, and calculate the voltage reference value based on the fourth electrical signal.

Specifically, the control module calculates the first voltage value according to Formula a, and calculates the voltage reference value according to Formula b.

Step 1013: Determine whether the difference between the first voltage value and the voltage reference value is greater than the first threshold.

Specifically, if the difference between the first voltage value and the voltage reference value is greater than the first threshold, step 1014 is performed, or if the difference between the first voltage value and the voltage reference value is not greater than the first threshold, step 1015 is performed.

Step 1014: Determine that the insulation monitoring circuit is faulty, and report a fault of the insulation monitoring circuit. The procedure ends.

Step 1015: Close the third switch and the first switch, open the second switch, collect the fifth electrical signal by using the first monitoring module, and calculate a voltage value of the positive electrode of the battery pack with respect to the low-voltage ground.

Specifically, the control module calculates the voltage value of the positive electrode of the battery pack with respect to the low-voltage ground according to Formula c.

Step 1016: Close the third switch and the second switch, open the first switch, collect the seventh electrical signal and the eighth electrical signal by using the first monitoring module and the second monitoring module, calculate the fourth voltage value of the low-voltage ground with respect to the negative electrode of the battery pack based on the seventh electrical signal, and calculate the fifth voltage value based on the eighth electrical signal.

Specifically, the control module calculates the fourth voltage value according to Formula f, and calculates the fifth voltage value according to Formula e.

Step 1017: Determine whether the difference between the fourth voltage value and the fifth voltage value is greater than the second threshold.

Specifically, if the difference between the fourth voltage value and the fifth voltage value is greater than the second threshold, step 1018 is performed; otherwise, step 1019 is performed.

Step 1018: Determine that the insulation monitoring circuit is faulty, and report a fault of the insulation monitoring circuit. The procedure ends.

Step 1019: Calculate the insulation resistance value of the vehicle based on the voltage reference value, the voltage value of the positive electrode of the battery pack with respect to the low-voltage ground, and the fourth voltage value.

Specifically, the control module calculates the insulation resistance values RN and RP of the vehicle according to Formula b, Formula c, and Formula f.

It should be noted that the foregoing description is merely an example, and does not constitute any limitation on the technical solutions of this application.

Compared with the prior art, in the method for monitoring an insulation monitoring circuit provided in this embodiment, the second monitoring module is added to the insulation monitoring circuit, and whether the insulation monitoring circuit is faulty is determined by using the second monitoring module. In this way, when the first voltage divider module or the second voltage divider module of the insulation monitoring circuit is faulty, the related fault can be detected in a timely manner. This reduces a problem of an excessively large deviation of insulation monitoring accuracy due to deviation of components of the insulation monitoring circuit, thereby reducing a risk of an electric shock on a human body due to aging or deviation, and improving the safety performance of the vehicle.

A second embodiment of this application relates to a method for monitoring an insulation monitoring circuit. The second embodiment is substantially the same as the first embodiment, and a main difference lies in that in the first embodiment, whether the insulation monitoring circuit is faulty is determined by monitoring the electrical signals of the first node and the second node. However, in the second embodiment of this application, whether an insulation monitoring circuit is faulty is determined by monitoring electrical signals of a first monitoring module and a second monitoring module.

Figure 8:
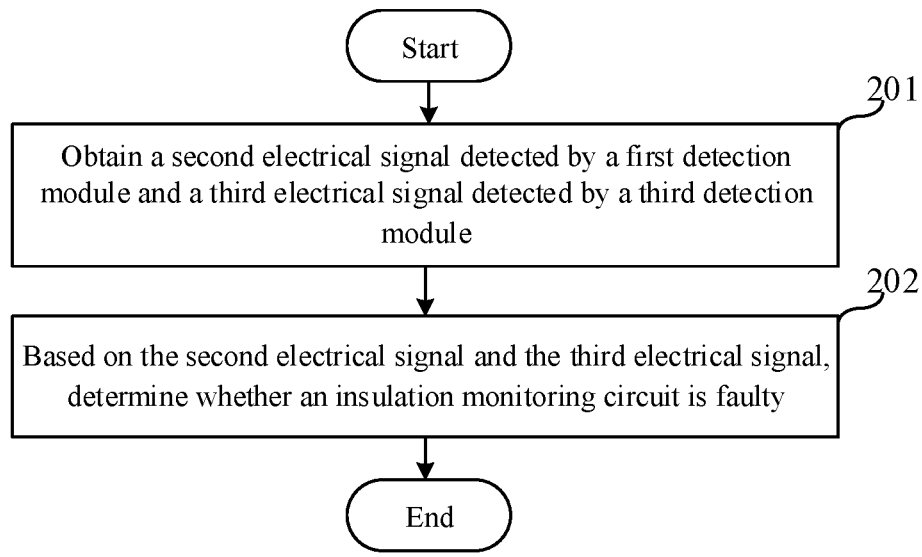
FIG. 8 is a flowchart of an insulation monitoring method according to a second embodiment of this application.

Specifically, as shown in FIG. 8, the method for monitoring an insulation monitoring circuit includes the following steps.

Step 201: Obtain a second electrical signal detected by the first monitoring module and a third electrical signal detected by a third monitoring module.

Specifically, the third monitoring module is configured to monitor an electrical signal between a third node and a fourth node.

In one embodiment, a first voltage divider unit and/or a second voltage divider unit are included between the third node and the fourth node, and a control module obtains the second electrical signal and the third electrical signal in a state in which the first switch and the third switch are closed and the second switch is open.

In another embodiment, a third voltage divider unit and/or a fourth voltage divider unit are included between the third node and the fourth node, and the control module obtains the second electrical signal and the third electrical signal in a state in which the second switch and the third switch are closed and the first switch is open.

It should be noted that, in this embodiment, a circuit structure of the insulation monitoring circuit is substantially the same as that in the first embodiment, and details are not described herein again. Persons skilled in the art may dispose the insulation monitoring circuit by referring to the related content of the first embodiment (as shown in FIG. 2).

Step 202: Based on the second electrical signal and the third electrical signal, determine whether the insulation monitoring circuit is faulty.

In terms of a manner of disposing the third monitoring module, the following uses examples to describe a method for determining whether the insulation monitoring circuit is faulty.

Case 1: A first end and a second end of the third monitoring module are respectively connected to the third node and the fourth node, a third end of the third monitoring module is connected to the control module, and the first voltage divider unit and/or the second voltage divider unit is included between the third node and the fourth node. The method for determining whether the insulation monitoring circuit is faulty includes the following two methods:

Method 1: The control module calculates a second voltage value between a positive electrode of a battery pack and a reference potential point based on the second electrical signal, a resistance value of the sampling module, a resistance value of the first voltage divider unit, and a resistance value of the second voltage divider unit; calculates a third voltage value between the positive electrode of the battery pack and the reference potential point based on the third electrical signal, the resistance value of the sampling module, the resistance value of the first voltage divider unit, and the resistance value of the second voltage divider unit; determines whether a difference between the second voltage value and the third voltage value is greater than a second threshold; and if a determination result is yes, determines that the insulation monitoring circuit is faulty. Specifically, in a normal case, the second voltage value between the positive electrode of the battery pack and the reference potential point that is calculated based on the second electrical signal detected by the first monitoring module should be the same as or close to the third voltage value calculated based on that by the third monitoring module. If the difference between the two is relatively large, it indicates that the second electrical signal detected by the first monitoring module is inaccurate, or any one of the sampling module, the first voltage divider unit, and the second voltage divider unit is deviated. Therefore, based on the second electrical signal and the third electrical signal, the control module may determine whether the insulation monitoring circuit is faulty.

It should be noted that the second threshold may be set based on errors of monitoring circuits sampled inside the first monitoring module and the third monitoring module and monitoring errors of the first monitoring module and the third monitoring module in combination with experience of the designer, which is not limited in this embodiment.

Figure 9:
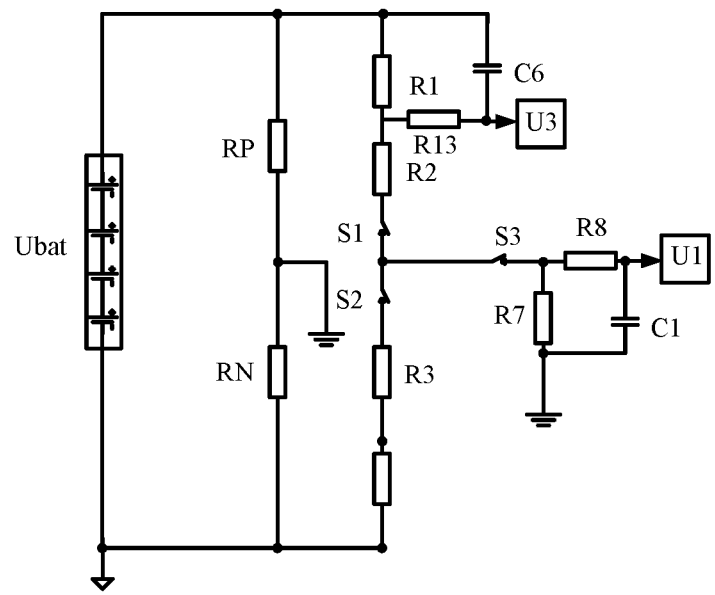
FIG. 9 is a schematic circuit diagram of a battery management system according to the second embodiment of this application.

Assuming that the third monitoring module is configured to monitor a voltage across two ends of the first voltage divider unit, a circuit diagram of the battery management system is shown in FIG. 9. R13 represents a sixth resistor, C6 represents a sixth capacitor, R13 and C6 form the third monitoring module, and U3 represents a third end of the third monitoring module. Meanings of other parameters are the same as those in FIG. 2. In a case in which the first switch and the third switch are closed and the second switch is open, the second electrical signal $u_2$ is obtained by sampling a voltage across two ends of R7 by the first monitoring module, and a voltage Up3 of the positive electrode of the battery pack with respect to the low-voltage ground can be obtained through inversion. A calculation formula is as follows:

$$Up3 = \frac{u_4}{R_7} \cdot (R_1 + R_2 + R_7) \qquad \text{Formula g}$$

The third electrical signal $u_3$ is obtained by sampling a voltage across two ends of the R1 by the third monitoring module, and a voltage Up4 of the positive electrode of the battery pack with respect to the low-voltage ground can be obtained through inversion. A calculation formula is as follows:

$$Up4 = \frac{u_4}{R_6} \cdot (R_1 + R_2 + R_7) \qquad \text{Formula h}$$

Because both the calculated values are voltages of the positive electrode of the battery pack with respect to the low-voltage ground, the two values are similar or the same in normal cases. If the first monitoring module is faulty, or the sampling module, the first voltage divider unit, or the second voltage divider unit is deviated, a difference between the two values is relatively large. Therefore, whether the insulation monitoring circuit is faulty can be determined based on Up3 and Up4. When the difference between Up3 and Up4 is greater than the second threshold, it is determined that the insulation monitoring circuit is faulty, and an insulation monitoring fault needs to be reported in this case.

It should be noted that through comparison of Up3 and Up4, the problem that a calculated insulation resistance value is inaccurate due to a fault of the sampling module and the first monitoring module can be avoided.

Method 2: The control module calculates, based on the second electrical signal and the resistance value of the sampling module, a first current value of a branch in which the sampling module is located; calculates, based on the third electrical signal and the resistance value of the first voltage divider unit and/or the resistance value of the second voltage divider unit, a second current value of a branch in which the first voltage divider unit and the second voltage divider unit are located; determines whether a difference between the first current value and the second current value is greater than a third threshold; and if a determination result is yes, determines that the insulation monitoring circuit is faulty. Specifically, when the first voltage divider unit is included between the third node and the fourth node, the control module calculates, based on the third electrical signal and the resistance value of the first voltage divider unit, the second current value of the branch in which the first voltage divider unit and the second voltage divider unit are located. When the second voltage divider unit is included between the third node and the fourth node, the control module calculates, based on the third electrical signal and the resistance value of the second voltage divider unit, the second current value of the branch in which the first voltage divider unit and the second voltage divider unit are located. When the first voltage divider unit and the second voltage divider unit are included between the third node and the fourth node, the control module calculates, based on the third electrical signal, the resistance value of the first voltage divider unit, and the resistance value of the second voltage divider unit, the second current value of the branch in which the first voltage divider unit and the second voltage divider unit are located. When the first switch and the third switch are closed and the second switch is open, the branch in which the sampling module is located and the branch in which the first voltage divider unit and the second voltage divider unit are located are the same branch. In normal cases, the first current value and the second current value should be the same or similar. When the difference between the first current value and the second current value is relatively large, it indicates that the second electrical signal sampled by the sampling module is inaccurate, or any one of the sampling module, the first voltage divider unit, and the second voltage divider unit is deviated. Therefore, based on the second electrical signal and the third electrical signal, the control module can determine whether the insulation monitoring circuit is faulty.

It should be noted that the third threshold may be set based on errors of monitoring circuits sampled inside the first monitoring module and the third monitoring module and monitoring errors of the first monitoring module and the third monitoring module in combination with experience of the designer, which is not limited in this embodiment.

Case 2: A first end and a second end of the third monitoring module are respectively connected to the third node and the fourth node, a third end of the third monitoring module is connected to the control module, and a third voltage divider unit and/or a fourth voltage divider unit are included between the third node and the fourth node. The method for determining whether the insulation monitoring circuit is faulty includes the following two methods:

Method A: The control module calculates a second voltage value between a negative electrode of a battery pack and a reference potential point based on the second electrical signal, a resistance value of the sampling module, a resistance value of the third voltage divider unit, and a resistance value of the fourth voltage divider unit; calculates a third voltage value between the negative electrode of the battery pack and the reference potential point based on the third electrical signal, the resistance value of the sampling module, the resistance value of the third voltage divider unit, and the resistance value of the fourth voltage divider unit; determines whether a difference between the second voltage value and a second voltage reference value is greater than a second threshold; and if a determination result is yes, determines that the insulation monitoring circuit is faulty. Specifically, in a normal case, the second voltage value, between the negative electrode of the battery pack and the reference potential point, calculated based on the second electrical signal detected by the first monitoring module should be the same as or close to the third voltage value calculated based on that by the third monitoring module. If the difference between the two is relatively large, it indicates that the second electrical signal detected by the first monitoring module is inaccurate, or any one of the sampling module, the first voltage divider unit, and the second voltage divider unit is deviated. Therefore, based on the second electrical signal and the third electrical signal, the control module may determine whether the insulation monitoring circuit is faulty.

Figure 10:
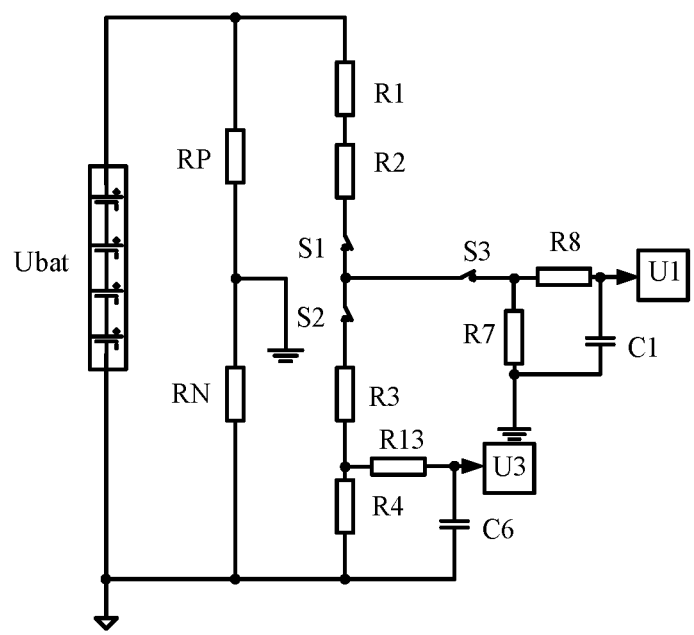
FIG. 10 is another schematic circuit diagram of the battery management system according to the second embodiment of this application.

Assuming that the third monitoring module is configured to monitor a voltage across two ends of the fourth voltage divider unit, a circuit diagram of the battery management system is shown in FIG. 10. R13 represents a sixth resistor, C6 represents a sixth capacitor, R13 and C6 form the third monitoring module, and U3 represents a third end of the third monitoring module. Meanings of other parameters are the same as those in FIG. 2. In a case in which the second switch and the third switch are closed and the first switch is open, the second electrical signal $u_2$ is obtained by sampling a voltage across two ends of R7 by the first monitoring module, and it can be learned from a current flow direction that $u_2$ is a negative value. A voltage Un3 of the low-voltage ground with respect to the negative electrode of the battery pack can be obtained through inversion. A calculation formula is as follows:

$$Un3 = \frac{-u_4}{R_7} \cdot (R_3 + R_4 + R_7) \qquad \text{Formula i}$$

The third electrical signal $u_3$ is obtained by sampling a voltage across two ends of the R4 by the third monitoring module, and it can be learned from a current flow direction that $u_3$ is a positive value. A voltage Un4 of the low-voltage ground with respect to the negative electrode of the battery pack can be obtained through inversion. A calculation formula is as follows:

$$Un4 = \frac{u_4}{R_4} \cdot (R_3 + R_4 + R_7) \qquad \text{Formula j}$$

Because both the calculated values are voltages of the negative electrode of the battery pack with respect to the low-voltage ground, the two values are similar or the same in normal cases. If the first monitoring module is faulty, or the sampling module, the third voltage divider unit, or the fourth voltage divider unit is deviated, a difference between the two values is relatively large. Therefore, whether the first monitoring module (a sampling chip of the insulation monitoring circuit) and the sampling module are faulty can be determined based on Un3 and Un4. When the difference between Un3 and Un4 is greater than the second threshold, it is determined that the insulation monitoring circuit is faulty, and an insulation monitoring fault needs to be reported in this case.

Method B: The control module calculates, based on the second electrical signal and the resistance value of the sampling module, a first current value of a branch in which the sampling module is located; calculates, based on the third electrical signal and the resistance value of the third voltage divider unit and/or the resistance value of the fourth voltage divider unit, a second current value of a branch in which the third voltage divider unit and the fourth voltage divider unit are located; determines whether a difference between the first current value and the second current value is greater than a third threshold; and if a determination result is yes, determines that the insulation monitoring circuit is faulty. Specifically, when the third voltage divider unit is included between the third node and the fourth node, the control module calculates, based on the third electrical signal and the resistance value of the third voltage divider unit, the second current value of the branch in which the third voltage divider unit and the fourth voltage divider unit are located. When the fourth voltage divider unit is included between the third node and the fourth node, the control module calculates, based on the third electrical signal and the resistance value of the fourth voltage divider unit, the second current value of the branch in which the third voltage divider unit and the fourth voltage divider unit are located. When the third voltage divider unit and the fourth voltage divider unit are included between the third node and the fourth node, the control module calculates, based on the third electrical signal, the resistance value of the third voltage divider unit, and the resistance value of the fourth voltage divider unit, the second current value of the branch in which the third voltage divider unit and the fourth voltage divider unit are located. When the second switch and the third switch are closed and the first switch is open, the branch in which the sampling module is located and the branch in which the third voltage divider unit and the fourth voltage divider unit are located are the same branch. In normal cases, the first current value and the second current value should be the same or similar. When the difference between the first current value and the second current value is relatively large, it indicates that the second electrical signal sampled by the sampling module is inaccurate, or any one of the sampling module, the third voltage divider unit, and the fourth voltage divider unit is deviated. Therefore, based on the second electrical signal and the third electrical signal, the control module can determine whether the insulation monitoring circuit is faulty.

It should be noted that persons skilled in the art can understand that, in actual application, the third monitoring module may monitor the electrical signal across two ends of the first voltage divider unit and/or the second voltage divider unit, and a seventh monitoring module is added to monitor the electrical signal across two ends of the third voltage divider unit and/or the fourth voltage divider unit. Based on the electrical signals detected by the first monitoring module, the third monitoring module, and the seventh monitoring module, the control module may determine whether the insulation monitoring circuit is faulty. For the monitoring process, refer to related descriptions in Case 1 and Case 2. Details are not described herein again.

It should be noted that the foregoing description is merely an example, and does not constitute any limitation on the technical solutions of this application.

Compared with the prior art, in the method for monitoring an insulation monitoring circuit provided in this embodiment, the third monitoring module is added to the insulation monitoring circuit, and whether the insulation monitoring circuit is faulty is determined based on the electrical signals detected by the first monitoring module and the third monitoring module. In this way, when the sampling module, the first monitoring module, the first voltage divider module, or the second voltage divider module is faulty, the related fault can be detected in a timely manner. This reduces a problem of an excessively large deviation of insulation monitoring accuracy due to deviation of components of the insulation monitoring circuit, thereby reducing a risk of an electric shock on a human body due to aging or deviation, and improving the safety performance of the vehicle.

Division of the steps in the foregoing various methods is merely intended for clarity of description. During implementation, the steps can be combined into one step, or some of the steps can be split into a plurality of steps, and all the steps fall within the protection scope of this patent provided that the same logical relationship is included. Modifications of no great importance added to or design of no great importance introduced to the algorithms or processes fall within the protection scope of this patent provided that the core design of the algorithms and processes is not changed.

Figure 11:
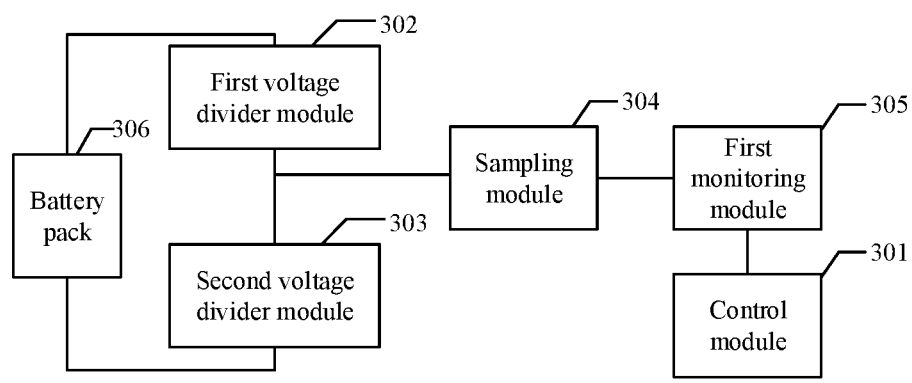
FIG. 11 is a schematic structural diagram of the battery management system according to the third embodiment of this application.

A third embodiment of this application relates to a battery management system. As shown in FIG. 11, the battery management system includes a control module 301 and an insulation monitoring circuit. The insulation monitoring circuit includes a first voltage divider module 302, a second voltage divider module 303, a sampling module 304, and a first monitoring module 305. A first end of the first voltage divider module 302 is connected to a positive electrode of a battery pack 306, a second end of the first voltage divider module 302 is connected to a first end of the second voltage divider module 303, a second end of the second voltage divider module 303 is connected to a negative electrode of the battery pack 306, a node between the second end of the first voltage divider module 302 and the first end of the second voltage divider module 303 is connected to a first end of the sampling module 304, a second end of the sampling module 304 is connected to a reference potential point, a first end of the first monitoring module 305 is connected to the first end of the sampling module 304, and a second end of the first monitoring module 305 is connected to the control module 301.

The first voltage divider module 302 includes a first voltage divider unit, a second voltage divider unit, and a first switch, and the first voltage divider unit, the second voltage divider unit, and the first switch are connected in series. The second voltage divider module 303 includes a third voltage divider unit, a fourth voltage divider unit, and a second switch, and the third voltage divider unit, the fourth voltage divider unit, and the second switch are connected in series. The sampling module 304 includes a third switch and a sampling unit, and the third switch and the sampling unit are connected in series. The control module 305 is configured to perform the method for monitoring an insulation monitoring circuit described in the foregoing embodiments.

It is not difficult to find that this embodiment is a system embodiment corresponding to the first embodiment, and this embodiment can be implemented in combination with the first embodiment. The related technical details described in the first embodiment are still valid in this embodiment. To avoid repetition, details are not described herein. Accordingly, the related technical details described in this embodiment can also be applied to the first embodiment.

Figure 12:
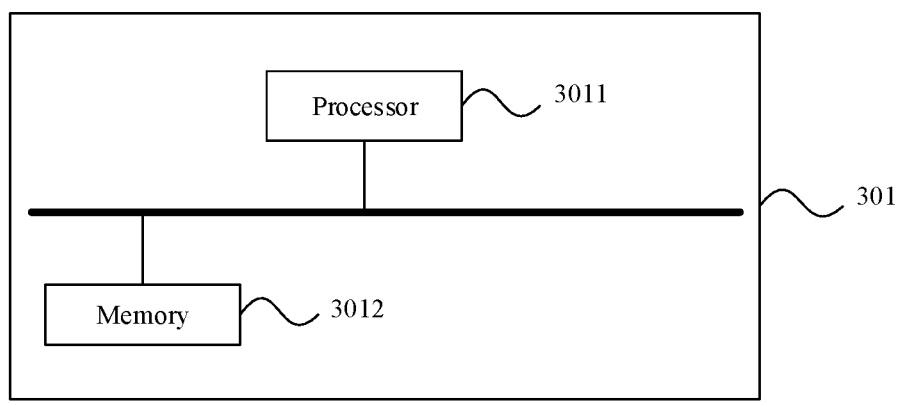
FIG. 12 is a schematic diagram of a hardware structure of a control module in a battery management system according to an embodiment of this application.

The control module 301 may be any appropriate control apparatus, such as a microcontroller or a controller. FIG. 12 shows a schematic diagram of a hardware structure of the control module 301. As shown in FIG. 12, the control module 301 includes one or more processors 3011 and a memory 3012. In FIG. 12, one processor 3011 is used as an example.

The processor 3011 and the memory 3012 may be connected through a bus or in other manners. Connection through a bus is used as an example in FIG. 12.

As a non-volatile computer-readable storage medium, the memory 3012 can be used to store non-volatile software programs, non-volatile computer-executable programs, and modules, such as program instructions/software modules, corresponding to the monitoring method in the embodiments of this application. The processor 3011 executes various functional applications and data processing of the control module 301 by running non-volatile software programs, instructions, and software modules stored in the memory 3012, that is, implementing the monitoring method of the foregoing method embodiment.

The memory 3012 may include a program storage area and a data storage area. The program storage area may store an operating system and an application program required by at least one function. The data storage area may store data created based on use of the control module. In addition, the memory 3012 may include a high-speed random access memory, and may further include a non-volatile memory such as a disk storage device, a flash memory device, or other non-volatile solid-state storage devices.

It should be noted that each module included in this embodiment is a logic module. In actual application, a logic unit may be a physical unit or a part of a physical unit, or may be implemented in a combination of a plurality of physical units. In addition, in order to highlight the inventive part of this application, units not closely related to resolving of the technical problem proposed in this application are not introduced in this embodiment; however, this does not mean that there are no other units in this embodiment.

Those of ordinary skill in the art can understand that the embodiments described above are specific embodiments of this application, and in actual application, various changes may be made thereto in form and detail without departing from the spirit and scope of this application.

Finally, it should be noted that the foregoing embodiments are merely used to describe the technical solutions of this application, and are not to be limited under the concept of this application. The technical features in the foregoing embodiments or different embodiments can also be combined. The steps may be implemented in any order, and there are many other variations in different aspects of this application as described above, which are not provided in detail for the sake of brevity. Although this application has been described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of this application.

What is claimed is:

1. A battery management system, comprising:
a control module; and
an insulation monitoring circuit;
wherein
the insulation monitoring circuit comprises a first voltage divider unit (R1), a second voltage divider unit (R2), a third voltage divider unit (R3), a fourth voltage divider unit (R4), a fifth voltage divider unit (R5), a sixth voltage divider unit (R6), a first monitoring circuit (R7, R8, C1), a second monitoring circuit (R9, C2), and a fourth monitoring circuit (R10, C3);
a first end of the first voltage divider unit (R1) is connected to a positive electrode of a battery pack, a second end of the first voltage divider unit (R1) is connected to a first end of the second voltage divider unit (R2), a second end of the second voltage divider unit (R2) is connected to a first end of the third voltage divider unit (R3), a second end of the third voltage divider unit (R3) is connected to a first end of the fourth voltage divider unit (R4), and a second end of the fourth voltage divider unit (R4) is connected to a negative electrode of the battery pack;
a first end of the fifth voltage divider unit (R5) is also connected to the positive electrode of the battery pack, a second end of the fifth voltage divider unit (R5) is connected to a first end of the sixth voltage divider unit (R6), and a second end of the sixth voltage divider unit (R6) is also connected to the negative electrode of the battery pack;
a first end of the first monitoring circuit is connected to a node between the second end of the first voltage divider unit (R1) and the first end of the second voltage divider unit (R2), and a second end of the first monitoring circuit (U1) is connected to the control module;
a first end of the second monitoring circuit is connected to a node between the second end of the third voltage divider unit (R3) and the first end of the fourth voltage divider unit (R4), and a second end of the second monitoring circuit (U2) is connected to the control module;
a first end of the fourth monitoring circuit is connected to a node between the second end of the fifth voltage divider unit (R5) and the first end of the sixth voltage divider unit (R6), and a second end of the fourth monitoring circuit (U4) is connected to the control module;
wherein the control module is configured to:
when the first end of the first monitoring circuit is disconnected from the node between the second end of the first voltage divider unit (R1) and the first end of the second voltage divider unit (R2) by a switch (S3), obtain a first electrical signal ($u_1$) at the second end of the second monitoring circuit (U2);
calculate a first voltage value (Ubat1) based on the first electrical signal ($u_1$);
obtain a fourth electrical signal ($u_4$) at the second end of the fourth monitoring circuit (U4);
calculate a first reference voltage value (Ubat2) based on the fourth electrical signal ($u_4$); and
determine, based on the first voltage value (Ubat1) and the first reference voltage value (Ubat2), whether the insulation monitoring circuit is faulty.

2. The battery management system according to claim 1, wherein in determining whether the insulation monitoring circuit is faulty, the control module is configured to:

determine the insulation monitoring circuit is faulty when the first voltage value and the first reference voltage value are not equal or a difference between the first voltage value and the first reference voltage value exceeds a voltage threshold.

3. The battery management system according to claim 1, wherein the first reference voltage value (Ubat2) is calculated by the following formula:

$$Ubat2 = u_4/R_6 \cdot (R_5 + R_6)$$

where $u_4$ is a voltage of the fourth electrical signal, $R_5$ and $R_6$ are resistances of the fifth voltage divider unit, and the sixth voltage divider unit, respectively.

4. The battery management system according to claim 1, wherein the first voltage value (Ubat1) is calculated by the following formula:

$$Ubat1 = u_1/R_4 \cdot (R_1 + R_2 + R_3 + R_4)$$

where $u_1$ is a voltage of the first electrical signal, $R_1$, $R_2$, $R_3$, $R_4$ are resistances of the first voltage divider unit, the second voltage divider unit, the third voltage divider unit, and the fourth voltage divider unit, respectively.

5. A method, performed by the control module of the battery management system according to claim 1, for monitoring the insulation monitoring circuit of the battery management system, comprising:
  when the first end of the first monitoring circuit is disconnected from the node between the second end of the first voltage divider unit (R1) and the first end of the second voltage divider unit (R2) by the switch (S3),
  obtaining a first electrical signal ($u_1$) at the second end of the second monitoring circuit (U2);
  calculating a first voltage value (Ubat1) based on the first electrical signal ($u_1$);
  obtaining a fourth electrical signal ($u_4$) at the second end of the fourth monitoring circuit (U4);
  calculating a first reference voltage value (Ubat2) based on the fourth electrical signal ($u_4$); and
  determining, based on the first voltage value (Ubat1) and the first reference voltage value (Ubat2), whether the insulation monitoring circuit is faulty.

6. The method according to claim 5, determining whether the insulation monitoring circuit is faulty comprises:
  determining the insulation monitoring circuit is faulty when the first voltage value and the first reference voltage value are not equal or a difference between the first voltage value and the first reference voltage value exceeds a voltage threshold.

7. A control module of a battery management system, comprising:
  a processor; and
  a memory unit storing program codes for execution by the processor;
  wherein the battery management system comprises the insulation monitoring circuit according to claim 1, and the control module is connected to the first monitoring circuit (U1), the second monitoring circuit (U2) and the fourth monitoring circuit (U4) of the insulation monitoring circuit;
  wherein by executing the program codes, the processor is configured to:
    when the first end of the first monitoring circuit is disconnected from the node between the second end of the first voltage divider unit (R1) and the first end of the second voltage divider unit (R2) by the switch (S3),
    obtain a first electrical signal ($u_1$) at the second end of the second monitoring circuit (U2);
    calculate a first voltage value (Ubat1) based on the first electrical signal ($u_1$);
    obtain a fourth electrical signal ($u_4$) at the second end of the fourth monitoring circuit (U4);
    calculate a first reference voltage value (Ubat2) based on the fourth electrical signal ($u_4$); and
    determine, based on the first voltage value (Ubat1) and the first reference voltage value (Ubat2), whether the insulation monitoring circuit is faulty.

* * * * *